(12) United States Patent
Cheng et al.

(10) Patent No.: US 12,158,493 B2
(45) Date of Patent: Dec. 3, 2024

(54) WAFER INSPECTION SYSTEM AND ANNULAR SEAT THEREOF

(71) Applicant: MPI CORPORATION, Chu-Pei (TW)

(72) Inventors: Yi-Hsuan Cheng, Chu-Pei (TW); Hung-I Lin, Chu-Pei (TW); Po-Han Peng, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 177 days.

(21) Appl. No.: 18/105,103

(22) Filed: Feb. 2, 2023

(65) Prior Publication Data

US 2023/0251303 A1    Aug. 10, 2023

Related U.S. Application Data

(60) Provisional application No. 63/308,613, filed on Feb. 10, 2022.

(30) Foreign Application Priority Data

Nov. 29, 2022   (TW) ................................. 111213154

(51) Int. Cl.
   *G01R 31/28*        (2006.01)
(52) U.S. Cl.
   CPC ................. *G01R 31/2831* (2013.01)
(58) Field of Classification Search
   CPC ............ G01R 1/06727; G01R 31/2886; G01R 31/2889; G01R 1/06716; G01R 1/07342; G01R 1/07307; G01R 1/07314; G01R 1/07378; G01R 1/06711; G01R 1/073; G01R 1/06738; G01R 31/2865; G01R 1/06772; G01R 1/067; G01R 1/0491; G01R 1/0408; G01R 31/2884; G01R 1/06744; G01R 31/26; G01R 31/2808;
   (Continued)

(56) References Cited

U.S. PATENT DOCUMENTS 6,164,894 A  * 12/2000 Cheng ................ G01R 31/2887
                                                    414/416.03
8,018,242 B2 *  9/2011 Nakayama ......... G01R 31/2889
                                                    324/755.01
(Continued)

FOREIGN PATENT DOCUMENTS

TW           M603962 U    11/2020

*Primary Examiner* — Vinh P Nguyen
(74) *Attorney, Agent, or Firm* — Birch, Stewart, Kolasch & Birch, LLP

(57) ABSTRACT

A wafer inspection system includes probe and supporting devices opposite to each other. The probe device includes a probe and an electrically conductive module for transmitting test signal of a driver IC. The supporting device includes a chuck, an annular elastic module detachably disposed on the chuck, and a carrier. The chuck has a supporting portion located correspondingly to a hollow portion of the annular elastic module, which is larger than or equal to the carrier in size on an imaginary horizontal plane, enabling the carrier carrying a wafer to be placed on the supporting portion to be electrically connected with the annular elastic module. When the wafer is contacted by the probe, the electrically conductive module is abutted against the annular elastic module to form a short-path test loop. As a result, it is convenient to pick and place the carrier and wafer, enhancing inspection efficiency.

18 Claims, 10 Drawing Sheets

(58) Field of Classification Search
CPC .......... G01R 31/2851; G01R 1/06705; G01R 31/31905; G01R 1/0675; G01R 1/0416; G01R 31/2601; G01R 31/2637; H01R 13/2407; H01R 12/52; H01R 13/2464; H01R 2201/20; H01R 13/2435; H01R 13/24; H01R 13/2428; H01R 12/714; H01R 13/2471; H01R 13/514; H01R 13/2442; H01R 43/02
See application file for complete search history.

(56) References Cited

U.S. PATENT DOCUMENTS

| | | | |
|---|---|---|---|
| 8,049,525 B2 * | 11/2011 | Yamada | G01R 31/2891 324/754.11 |
| 11,181,572 B2 | 11/2021 | Zhuang et al. | |

* cited by examiner

WAFER INSPECTION SYSTEM AND ANNULAR SEAT THEREOF

CROSS REFERENCE TO RELATED APPLICATIONS

This non-provisional application claims the benefit under 35 U.S.C. § 119 (e) to U.S. Provisional Application No. 63/308,613, filed on Feb. 10, 2022, and under 35 U.S.C. § 119 (a) to Patent Application No. 111213154, filed in Taiwan on Nov. 29, 2022, all of which are hereby expressly incorporated by reference into the present application.

BACKGROUND OF THE INVENTION

1. Field of the Invention

The present invention relates generally to inspection systems and more particularly, to a wafer inspection system, and an annular seat of the wafer inspection system.

2. Description of the Related Art

Referring to FIG. 1, it is well known that a vertical type die refers to a die provided with a positive contact and a negative contact respectively on the front and back thereof. For example, the back 12 of a wafer 11 may serve as a common plane negative contact of all dies of the wafer 11. The vertical type die is usually a light emitting die, such as VCSEL, micro LED, mini LED, and so on and the light emitting portion thereof is located on the front 13 of the wafer 11. As regards the probing of the above-described vertical type die, the positive electrode of the die, i.e., the front of the wafer, is usually contacted by a probe 15 of a probe device 14, such as a probe card or an edge sensor. A driver integrated circuit chip 16 (hereinafter referred to as "driver IC") is electrically connected to the probe device 14 through a cable 17. The wafer 11 is supported by an electrically conductive supporting unit 19 and the driver IC 16 is also electrically connected to the supporting unit 19 through a cable 18. A test loop is thus formed and the test signal outputted from the driver IC 16 is able to be transmitted to the positive electrode of the die via the cable 17 and the probe device 14 and then transmitted back to the driver IC 16 from the negative electrode of the die, i.e., the back of the wafer, via the supporting unit 19 and the cable 18, so that the light emitting portion on the front of the die emits light. The light emitting from the die is received by a light receiving device (not shown), such as an integrating sphere, located above the probe device 14 for the measurement of optical characteristics.

However, for the test signal transmission manner adopted in the above-described inspection system that the test signal is outputted from the driver IC 16 and transmitted back to the driver IC 16 through the cables 17 and 18, the material of the cables 17 and 18 will affect the test signal transmitted therethrough. Further, because of long transmission path length, the test signal is liable to be affected by inductance effect to cause serious deformation and distortion of waveform of short-pulse and large-current test signal, thus making the inspection imprecise or even invalid. Accordingly, the above-described inspection system cannot satisfy the test requirement of the short-pulse test signal.

U.S. Pat. No. 11,181,572 discloses another inspection system without such cable, e.g., the cable 18 shown in FIG. 1, which is provided between the supporting unit for supporting the wafer, i.e., a wafer carrier, and the driver IC. The supporting unit for supporting the wafer is provided thereon with a plurality of conducting units protruding upwardly. The positive contact of the driver IC is electrically connected with the probe and the negative contact of the driver IC is electrically connected with an electrically conductive portion provided on the bottom surface of the probe device. When the positive electrode of the die is contacted by the probe, the electrically conductive portion of the probe device and the conducting unit located on the supporting unit are in contact with each other and thereby electrically connected with each other. In this way, a test loop with a reduced transmission path length is formed, which can satisfy the test requirement of short-pulse test signal.

Taiwan Patent No. M603962 also discloses an inspection system similar to the above-described one. In FIG. 8 of the aforesaid Taiwan patent, conducting units and an annular-shaped fastening frame compose a bridging module. This bridging module is disposed on a supporting device in a detachable manner. Because the wafer is fragile in structure and thereby unable to be conveyed individually, the supporting device includes a chuck and a carrier. The wafer is disposed on the carrier and placed on the chuck along with the carrier. Then, the fastening frame of the bridging module is pressed on the carrier in a way that the wafer is located in a hollow portion of the fastening frame. In this way, when the wafer is probed by the probe, the conducting units surrounding the wafer are able to be in contact with an electrically conductive portion of the probe device and thereby electrically connected therewith, and thus a test loop with a reduced transmission path length is formed.

SUMMARY OF THE INVENTION

However, for the above-described inspection system, when a wafer, which has been completely inspected by the probe device, is going to be moved to the next station for another inspection process, the wafer has to be moved together with the carrier but the carrier is pressed by the fastening frame of the bridging module, so the user has to dismount the bridging module before moving the carrier and the wafer. This manner makes the inspection process complicated and time-consuming.

The present invention has been accomplished in view of the above-noted circumstances. It is an objective of the present invention to provide a wafer inspection system and an annular seat of the wafer inspection system, which can satisfy the test requirement of short-pulse test signal, and is convenient to pick and place the carrier and the wafer, thereby enhancing the inspection efficiency.

To attain the above objective, the present invention provides a wafer inspection system which comprises a probe device, and a supporting device disposed opposite to the probe device. The probe device includes a probe and an electrically conductive module, which are configured for being electrically connected with a driver IC and transmitting a test signal of the driver IC. The supporting device includes a chuck, an annular elastic module detachably disposed on the chuck, and a carrier configured to support a back of a wafer. The annular elastic module is electrically connected with the chuck. The annular elastic module has a hollow portion. The chuck has a supporting portion located correspondingly to the hollow portion. The hollow portion is larger than the carrier in size on an imaginary horizontal plane perpendicular to a vertical axis, enabling the carrier carrying the wafer to be placed on the supporting portion of the chuck to be electrically connected with the annular elastic module. When the probe device and the supporting device are moved relative to each other along the vertical axis in a way that a front of the wafer is contacted by the probe, the electrically conductive module and the annular elastic module are abutted against each other, thereby forming a test loop.

As a result, in the present invention no cable has to be provided between the supporting device and the driver IC for electrical connection, so the test loop has a reduced transmission path length and thereby the present invention can satisfy the test requirement of short-pulse test signal. Besides, after being installed on the chuck, the annular elastic module of the supporting device is not required to be detached for picking and placing the wafer. The carrier carrying the wafer to be inspected can be directly placed on the supporting portion of the chuck. After the wafer inspection is accomplished, the carrier together with the wafer can be directly moved to another inspection station. In this way, it is convenient to pick and place the carrier together with the wafer, so that the inspection efficiency can be enhanced.

To attain the above objective, the present invention further provides an annular seat of a wafer inspection system, which is configured to be disposed with at least one elastic contact member, and configured to be detachably disposed on a chuck for a wafer inspection in a way that the at least one elastic contact member is electrically connected with the chuck. The at least one elastic contact member protrudes toward a probe device along a vertical axis. The at least one elastic contact member is configured to electrically contact the probe device. The annular seat comprises a hollow portion. The hollow portion is larger than a carrier, which is configured for carrying a wafer, in size on an imaginary horizontal plane perpendicular to the vertical axis, enabling the carrier to be placed on a portion of the chuck located correspondingly to the hollow portion.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
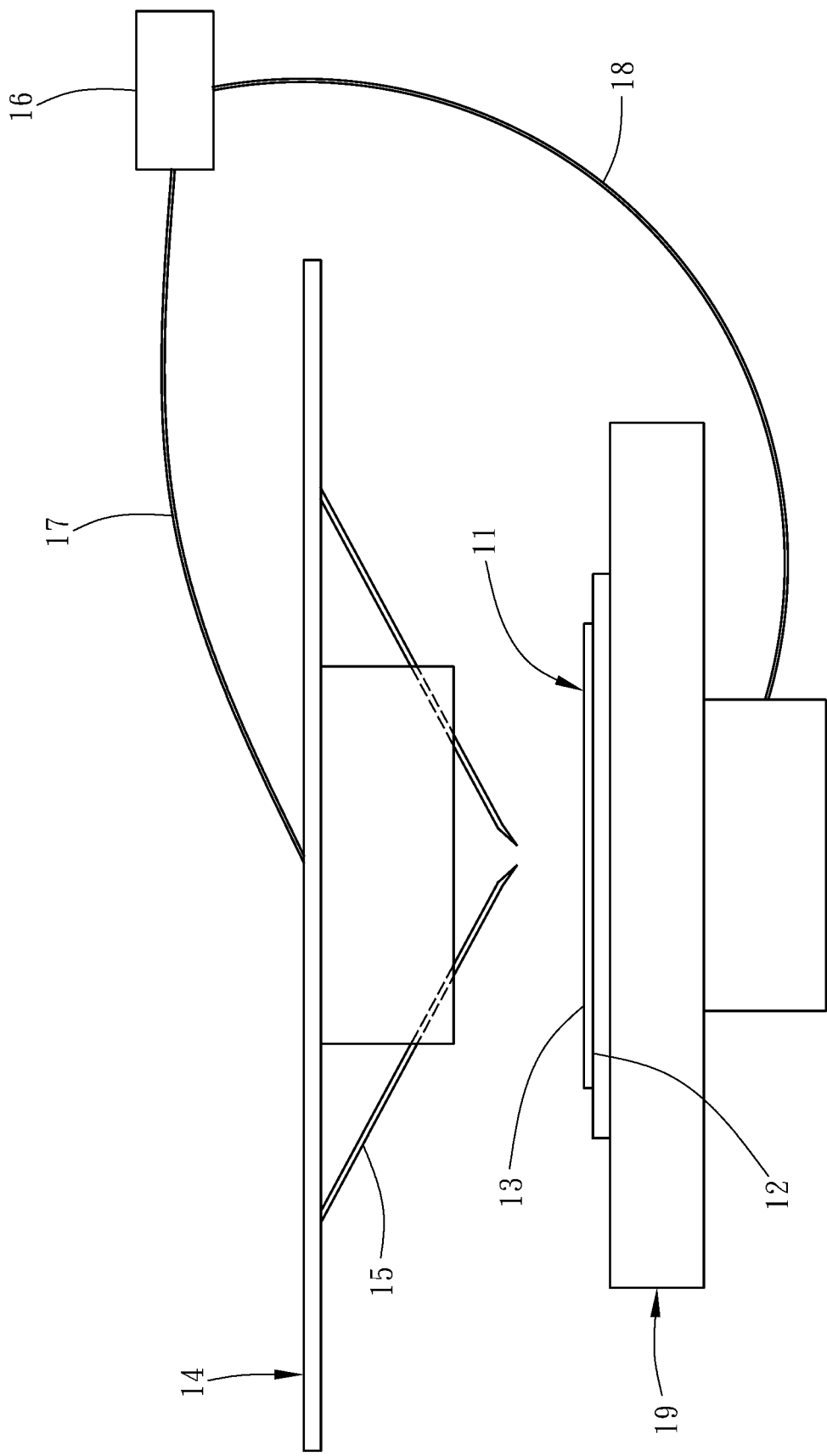
FIG. 1 is a schematic view of a conventional wafer inspection system and a wafer.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 2:
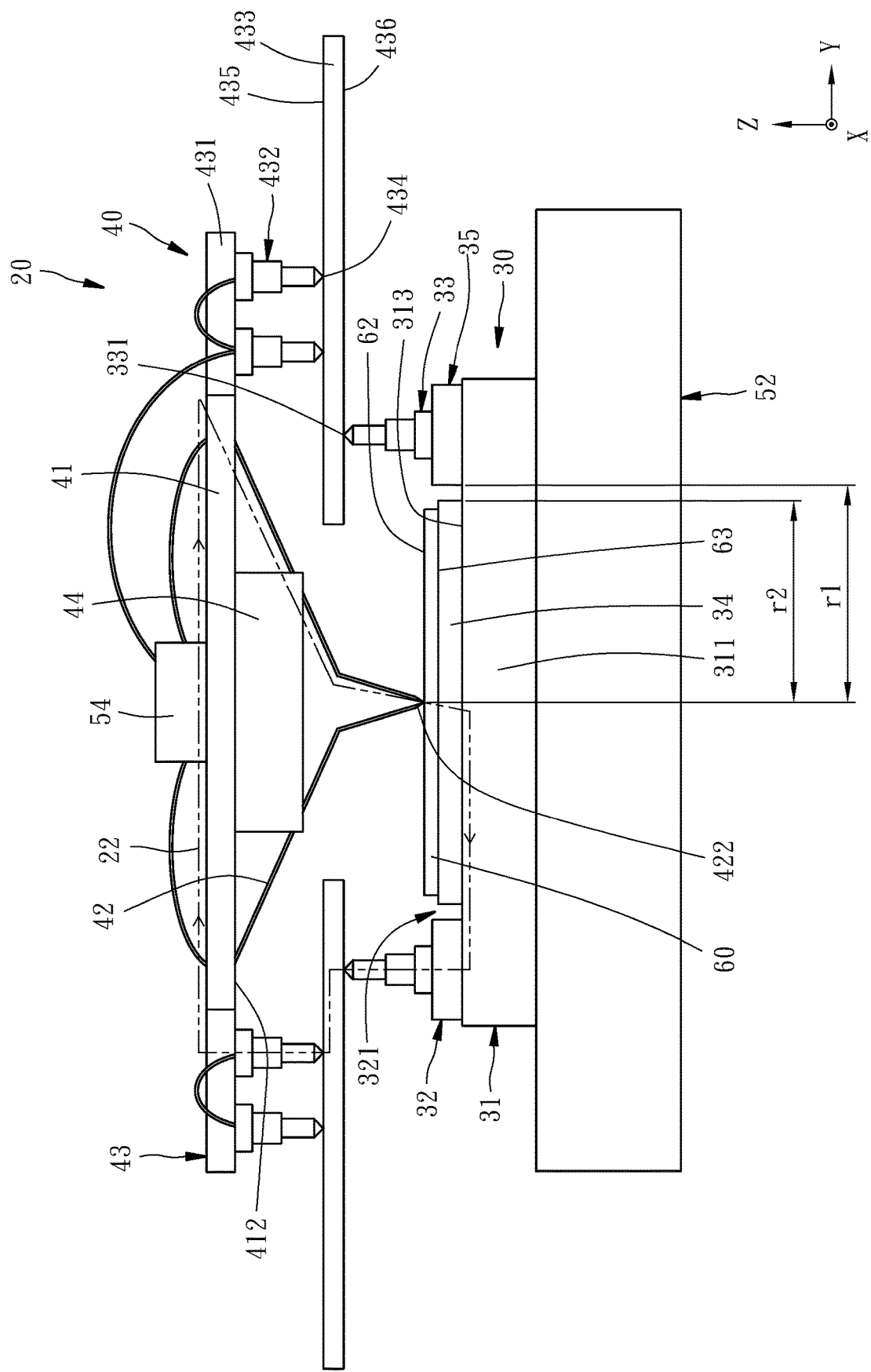
FIG. 2 is a schematic sectional view of a wafer inspection system and a wafer according to a first preferred embodiment of the present invention.

Referring to FIG. 2, a wafer inspection system 20 according to a first preferred embodiment of the present invention primarily includes a supporting device 30, and a probe device 40 disposed opposite to the supporting device 30.

The supporting device 30 and the probe device 40 are movable relative to each other along a vertical axis (Z-axis) and two horizontal axes (X-axis and Y-axis). For example, the probe device 40 in this embodiment is fastened by a fastening device (not shown) to be disposed above the supporting device 30, which means the probe device 40 is fixed and stationary. The supporting device 30 is disposed on a moving device 52 and capable of being driven by the moving device 52 to move along X-axis, Y-axis, and Z-axis. FIG. 2 shows the status that the supporting device 30 has been moved upwardly along the vertical axis (Z-axis) to be in contact with the probe device 40, which is the status that the inspection is proceeding. A detailed description is given below.

The supporting device 30 is adapted to support a wafer 60. The wafer 60 includes many tiny vertical type dies. For simplifying the figures, the dies of the wafer 60 are not shown in the figures of the present invention. The positive contacts of the dies are located on the front 62 of the wafer 60, i.e., the surface facing toward the probe device 40. The back 63 of the wafer 60 is a common plane negative contact of the dies. Alternatively, the positions of the positive and negative contacts may be exchanged.

The supporting device 30 includes a chuck 31 installed on the moving device 52, an annular seat 32 detachably disposed on the chuck 31, a plurality of elastic contact members 33 disposed on the annular seat 32 and protruding toward the probe device 40 along the vertical axis, and a carrier 34. The back 63 of the wafer 60 is attached to the carrier 34. When the wafer 60 is to be inspected, the carrier 34 is moved by a pick-and-place device (not shown) to be placed on the chuck 31, so that the wafer 60 is placed on the chuck 31 along with the carrier 34. Specifically speaking, the chuck 31 in this embodiment is shaped as a flat table. The annular seat 32 is disposed along the periphery of the chuck 312. The annular seat 32 has a hollow portion 321. The elastic contact members 33 are arranged to surround the hollow portion 321. The portion of the chuck 31 located below the hollow portion 321 and thereby not covered by the annular seat 32 is a supporting portion 311 of the chuck 31. The hollow portion 321 of the annular seat 32 is larger than the carrier 34 in size on an imaginary horizontal plane (X-Y plane) perpendicular to the vertical axis (Z-axis). Specifically speaking, in the condition that the hollow portion 321 and the carrier 34 are both approximately circular in shape, the inner radius r1 of the annular seat 32 is larger than the outer radius r2 of the carrier 34, enabling the carrier 34 to be placed on the supporting portion 311 of the chuck 31 through the hollow portion 321. The chuck 31, the annular seat 32, the elastic contact members 33 and the carrier 34 are all made of electrically conductive material, such as metal, thereby electrically connected with each other and thus all electrically connected with the back 63 of the wafer 60 carried by the carrier 34. However, in the present invention the hollow portion 321 of the annular seat 32 is unlimited to be larger than the carrier 34 in size on the imaginary horizontal plane (X-Y plane). For example, the hollow portion 321 of the annular seat 32 may be equal to the carrier 34 in size on the imaginary horizontal plane (X-Y plane), or the inner radius r1 of the annular seat 32 may be equal to the outer radius r2 of the carrier 34. The term 'equal' mentioned herein refers to the expression showing the state of the same circumstances, including the state with tolerance or difference within the extent of attaining the same function. Besides, the annular seat 32 in the present invention is unlimited to be shaped as a closed circle, but may be a combination of a plurality of components and thereby shaped as a discontinuous circle with open parts.

Figure 10:
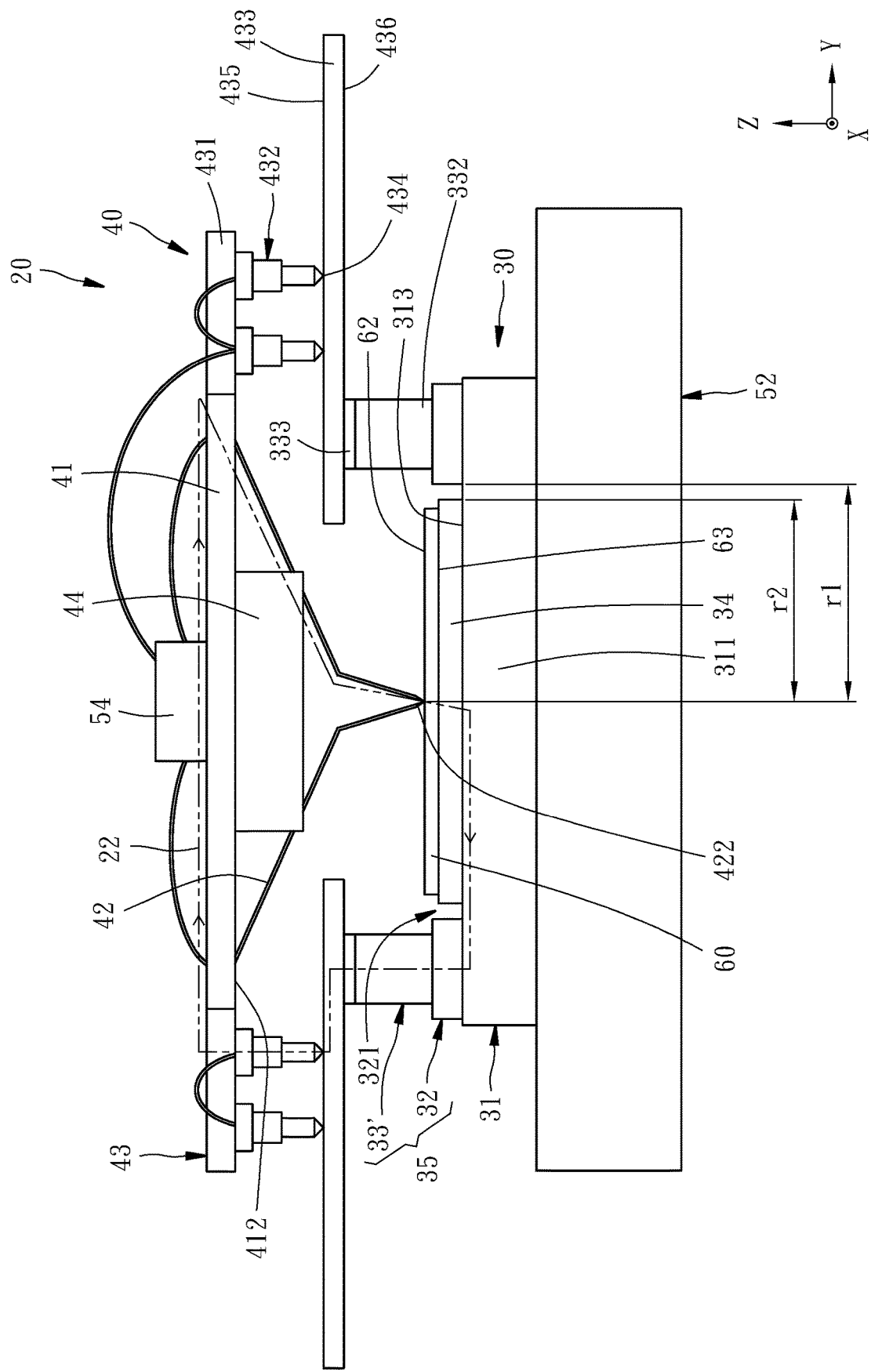
FIG. 10 is similar to FIG. 2, but showing a different type of elastic contact member.

The elastic contact members in the present invention, including the above-described elastic contact members 33 of the supporting device 30 and elastic contact members 432 of the probe device 40 to be described hereinafter, may be the conventional vertical elastic probe (e.g., pogo pin), which is provided in a metal housing thereof with a spring and has a top rod slidably installed in the metal housing. An end of the top rod is located in the metal housing and abutted against the spring. Another end of the top rod is exposed out of the metal housing to form a contact head. When a contact tip of the contact head, such as the contact tip 331 of the elastic contact member 33 and the contact tip 434 of the elastic contact member 432, is abutted and pressed, the spring is pressed and thereby elastically compressed. In the present invention, the vertical axis refers to the axis, along which the supporting device 30 and the probe device 40 are moved to approach each other to present a probing status. The elastic contact members 33 protrude from the annular seat 32 toward the probe device 40 along the vertical axis. However, the above-described elastic contact member is only an embodiment, not limitative to the structure and configuration of the elastic contact member in the present invention. For example, the elastic contact member may be a geometric structure of the integration or combination of elastically deformable soft material and electrically conductive material, such as an elastically deformable silicone or rubber component with rectangular or circular cross-sections and a surface provided with an electrically conductive layer. Alternatively, for example, the elastic contact member may be an EMI Gasket, a silicone conductive rubber, a zebra connector or an anisotropic conductive film (ACF), and so on. Specifically speaking, in the embodiment shown in FIG. 2, the annular seat 32 and the plurality of elastic contact members 33 compose an annular elastic module 35. However, as shown in FIG. 10, in the present invention the annular elastic module 35 of the supporting device 30 may be composed of the annular seat 32 and an annular elastic contact member 33'. As described above, the elastic contact member 33' may include an elastic body 332 and an electrically conductive layer 333 provided on the surface of the elastic body 332, or the elastic contact member 33' may be any structure instanced above. Besides, in the present invention the annular elastic module 35 of the supporting device 30 may include no such annular seat 32, but only include the above-described elastic contact member 33'.

The probe device 40 primarily includes a substrate 41, a plurality of electrically conductive probes 42, and an electrically conductive module 43. The probe device 40 may be a probe card and the substrate 41 is a circuit board of the probe card. A fastening block 44 made of black resin is fixed on a lower surface 412 of the substrate 41. The probes 42 are arranged in two lines along the X-axis and fastened to the lower surface 412 of the substrate 41 by the fastening block 44. The probe 42 is provided at an end thereof with a probe tip 422, and has the other end electrically connected to the substrate 41. The electrically conductive module 43 in this embodiment includes an installation plate 431 disposed on the periphery of the substrate 41, a plurality of electrically conductive elastic contact members 432, and an electrically conductive connecting plate 433. The elastic contact members 432 are arranged by taking the probes 42 as the center and arranged in two lines along the X-axis around two opposite sides of the probes 42 respectively, and preferably arranged symmetrically. The contact tip 434 of each elastic contact member 432 is abutted against an upper surface 435 of the connecting plate 433. A lower surface 436 of the connecting plate 433 faces toward the supporting device 30.

The probe device 40 is adapted to transmit test signal between a driver IC 54 and the wafer 60. The driver IC 54 may be directly fixed to the substrate 41 of the probe device 40 and electrically connected with the probes 42 and the elastic contact members 432 of the electrically conductive module 43 through internal circuits of the substrate 41 or external conductive wires respectively. Specifically speaking, the probes 42 are respectively electrically connected with the positive contacts of the driver IC 54. The elastic contact members 432 of the electrically conductive module 43 may be connected in series or in parallel and then collectively electrically connected to the negative contact of the driver IC 54. The connecting plate 433 is electrically connected with the negative contact of the driver IC 54 through the elastic contact members 432. The arrangement between the driver IC 54 and the probe device 40 is unlimited to that provided in this embodiment. In other words, the driver IC 54 is not required to be directly fixed to the substrate 41 of the probe device 40. For example, the driver IC 54 and the substrate 41 of the probe device 40 are electrically connected with each other through external conductive wires, and the driver IC 54 is disposed close to the probe device 40.

When the front 62 of the wafer 60 is contacted by the probes 42, at least one elastic contact member 33 of the supporting device 30 is abutted against the lower surface 436 of the connecting plate 433. Alternatively, if the elastic contact member is the geometric structure made of elastically deformable soft electrically conductive material as shown in FIG. 10, at least a part of the elastic contact member 33' is abutted against the lower surface 436 of the connecting plate 433. The test signal outputted from the positive contacts of the driver IC 54 can be transmitted to the positive contacts of the probed dies via the probes 42 and then transmitted back to the negative contact of the driver IC 54 from the negative contact on the back 63 of the wafer via the carrier 34, the chuck 31, the annular seat 32, the elastic contact member 33 or 33', the connecting plate 433 and the elastic contact members 432 sequentially, and thus a test loop 22 as shown in FIG. 2 or FIG. 10 is formed accordingly.

As a result, no cable for transmitting signal has to be provided between the supporting device 30 and the driver IC 54 in the present invention. Further, in this embodiment that the driver IC 54 is directly fixed to the substrate 41 of the probe device 40, a cable for transmitting signal can also be omitted between the probe device 40 and the driver IC 54. Accordingly, the test loop 22 formed in the present invention has a reduced transmission path length, and therefore the present invention can satisfy the test requirement of short-pulse test signal. Besides, after being installed on the chuck 31, the annular seat 32 of the supporting device 30 is not required to be detached for picking and placing the wafer 60. The carrier 34 carrying the wafer 60 to be inspected can be directly placed on the supporting portion 311 of the chuck 31. After the inspection for the wafer 60 is accomplished, the carrier 34 together with the wafer 60 can be directly moved to another inspection station. In this way, it is convenient to pick and place the carrier 34 together with the wafer 60, so that the inspection efficiency can be enhanced.

The probe 42 in the present invention is unlimited to the cantilever probe used in this embodiment. For example, the probe 42 may be the conventional vertical elastic probe, which means the probe may be similar to the elastic contact member 33 or 432. The number and arranged manner of the probes 42 are unlimited to those provided in this embodiment, as long as there is at least one probe 42. The number and arranged manner of the elastic contact members 33 and 432 are also unlimited to those provided in this embodiment, as long as the test loop as described above is formed when each die of the wafer 60 is contacted by the probe 42. The electrically conductive module 43 of the probe device 40 is unlimited to that provided in this embodiment, as long as the elastic contact member 33 of the supporting device 30 is abutted against the electrically conductive module 43 to form the test loop as described above when each die of the wafer 60 is contacted by the probe 42. For example, the electrically conductive module 43 and the substrate 41 may be formed integrally, or combined into a whole after assembly. Specifically speaking, the connecting plate 433 may be a part of the substrate 41. Alternatively, the connecting plate 433 is directly electrically connected with the installation plate 431 without any elastic contact member 432 therebetween.

Referring to FIG. 3 to FIG. 8, the supporting device 30' provided in a second preferred embodiment of the present invention has another configuration design. The supporting device 30' can be used in coordination with the probe device 40 provided in the first preferred embodiment (the related structure and function are as described above) to compose a wafer inspection system. As described above, the probe 42 and the electrically conductive module 43 of the probe device 40 are unlimited to those provided in the first preferred embodiment.

Figure 3:
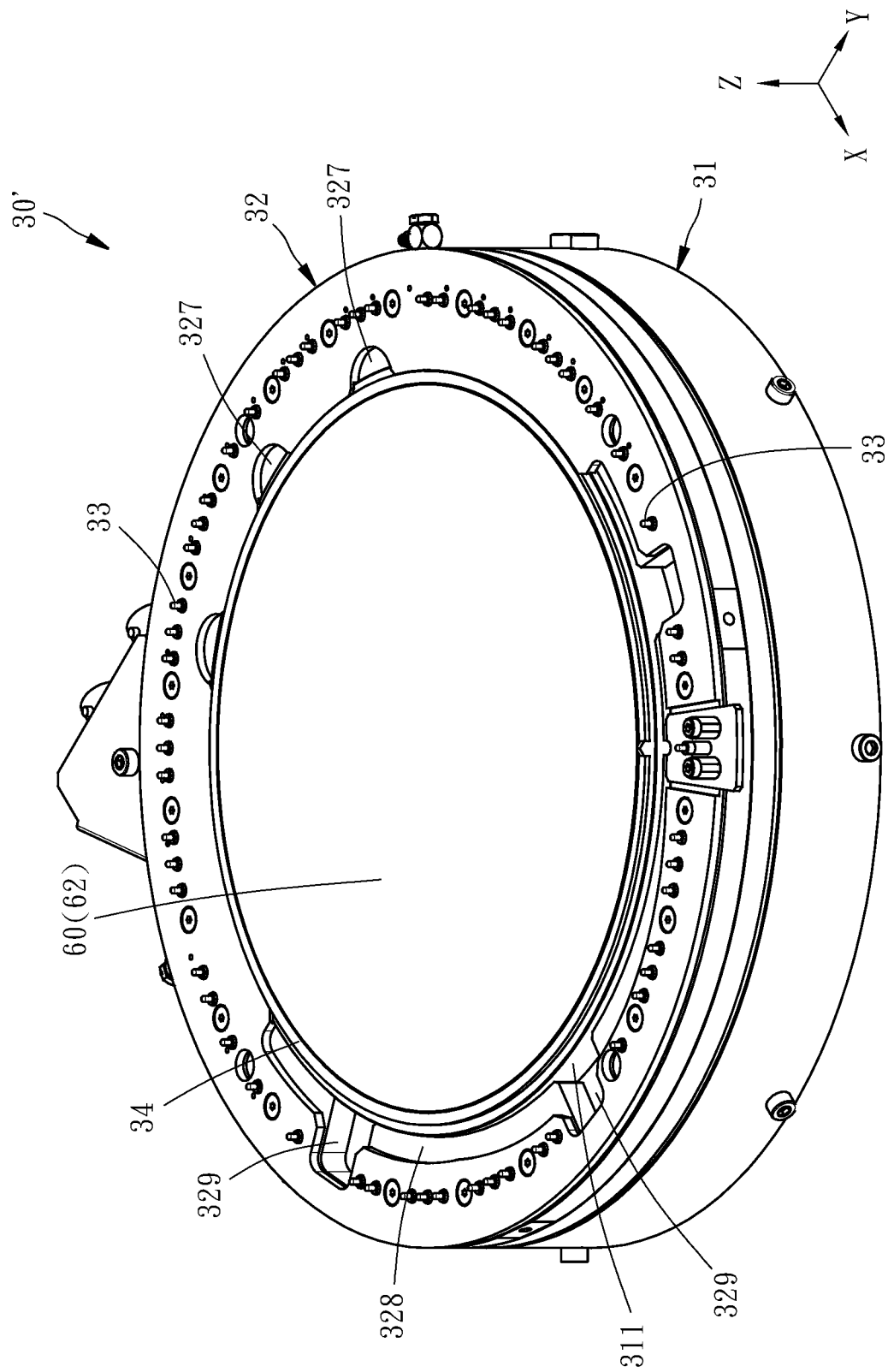
FIG. 3 is an assembled perspective view of a supporting device of a wafer inspection system and a wafer according to a second preferred embodiment of the present invention.
Figure 4:
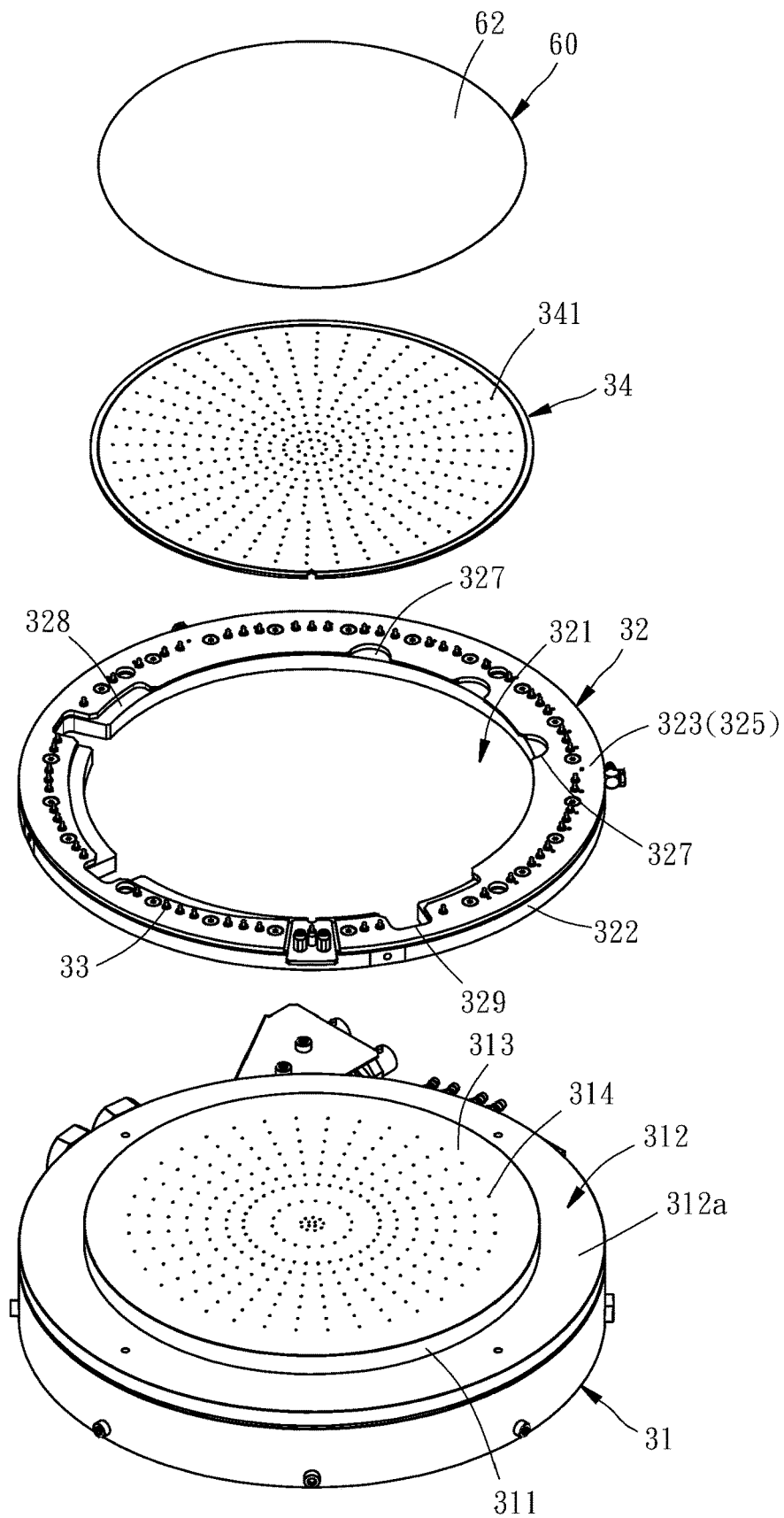
FIG. 4 is an exploded perspective view of the supporting device of the wafer inspection system and the wafer according to the second preferred embodiment of the present invention.

As shown in FIG. 3 and FIG. 4, the supporting device 30' includes a chuck 31, an annular seat 32 detachably disposed on the chuck 31 by bolts (not shown), a plurality of elastic contact members 33 (the related structure and function are as described above) disposed on the annular seat 32 and arranged to surround a hollow portion 321 thereof, and a carrier 34 configured to carry a wafer 60. The carrier 34 in this embodiment has a plurality of vacuum suction holes 341, which are configured to communicate with a vacuum source (not shown), so that the vacuum source makes the vacuum suction holes 341 generate a vacuum suction effect to attach the wafer 60 to the carrier 34, so as to prevent the wafer 60 from falling and the resulting damage during the transportation. However, the carrier 34 in the present invention is unlimited to have vacuum suction holes 341.

Figure 5:
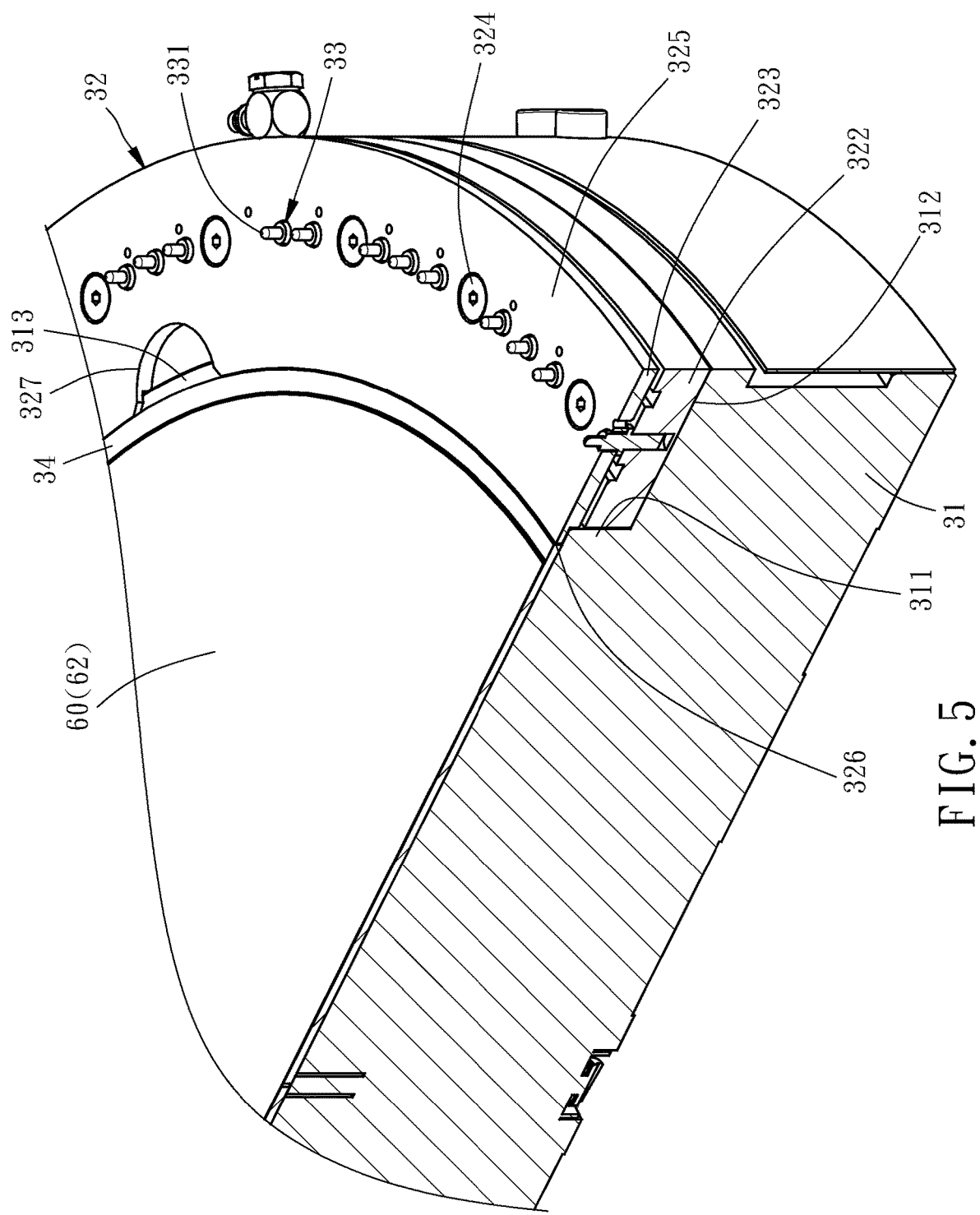
FIG. 5 is a partially cutaway perspective view of the supporting device of the wafer inspection system and the wafer according to the second preferred embodiment of the present invention.
Figure 6:
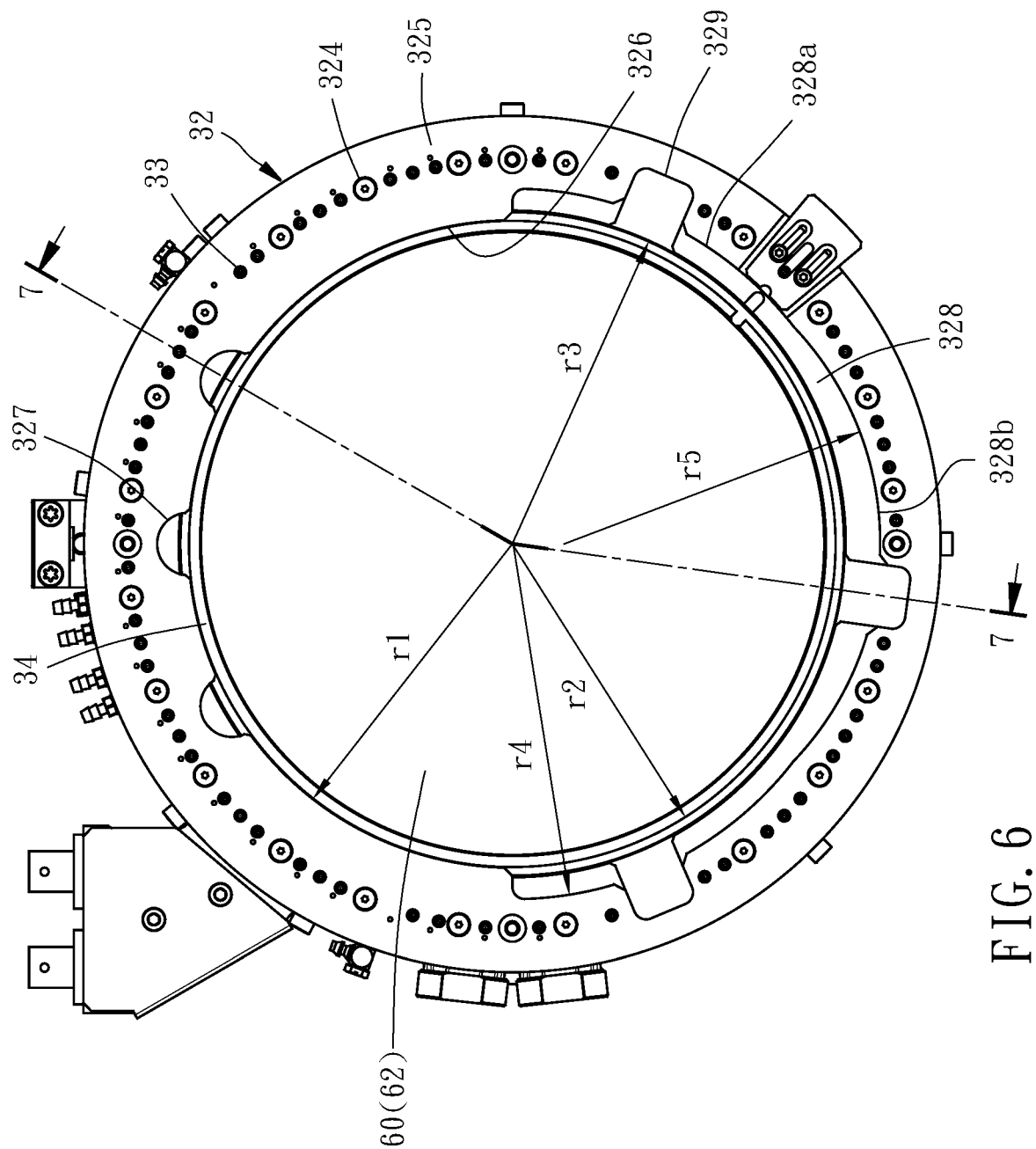
FIG. 6 is a top view of the supporting device of the wafer inspection system and the wafer according to the second preferred embodiment of the present invention.
Figure 7:
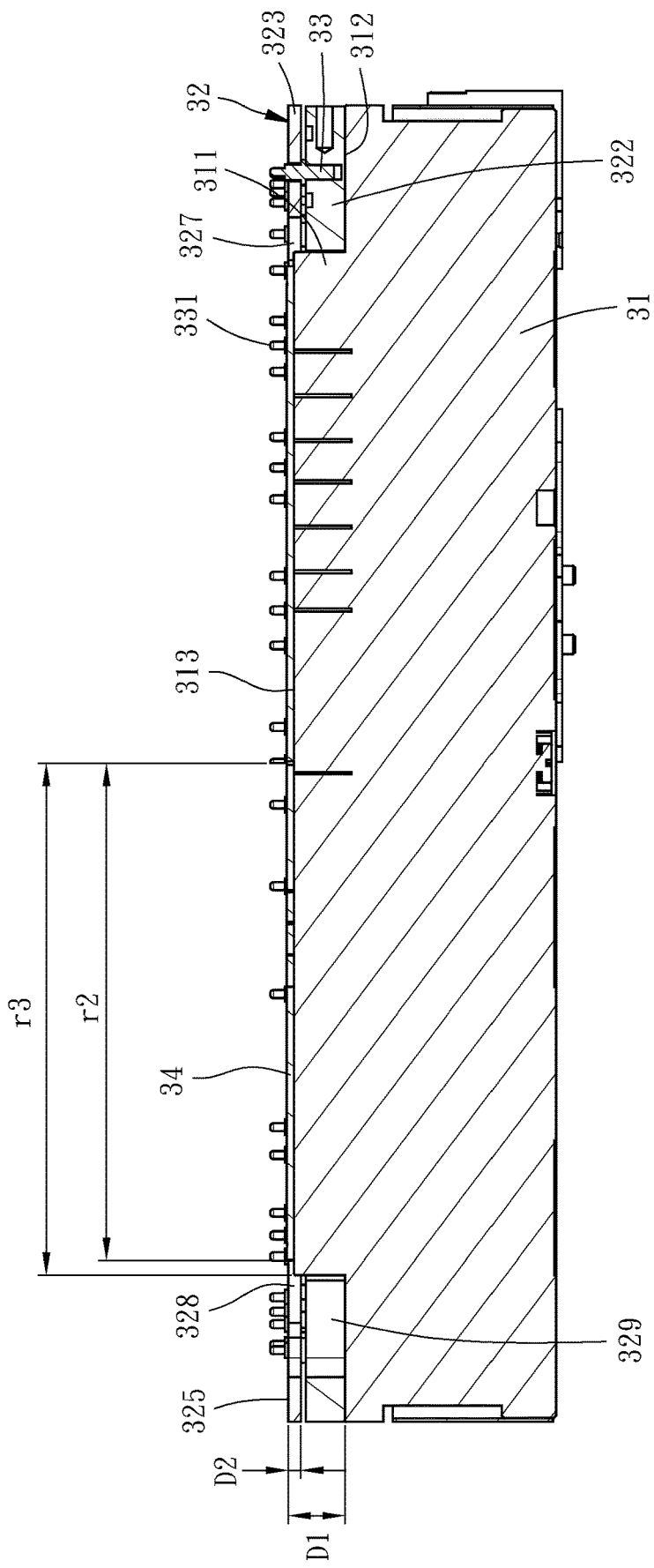
FIG. 7 is a sectional view taken along the line 7-7 in FIG. 6.

The chuck 31 in this embodiment has a circular supporting portion 311, and an annular groove 312 located on the periphery of the supporting portion 311. The annular groove 312 has an installation surface 312a. The installation surface 312a of the annular groove 312 is lower in position of height on the vertical axis than a supporting surface 313 of the supporting portion 311. In other words, a level difference is formed between the installation surface 312a of the annular groove 312 and the supporting surface 313 of the supporting portion 311. The annular seat 32 is disposed in the annular groove 312, so that the supporting portion 311 of the chuck 31 is located in the hollow portion 321 of the annular seat 32. As shown in FIG. 5, the annular seat 32 in this embodiment includes a relatively thicker bottom plate 322, a relatively thinner top plate 323, and a plurality of bolts 324 fastening the bottom plate 322 and the top plate 323 to each other. Each elastic contact member 33 is fixed by the bottom plate 322 and the top plate 323 and protrudes out of a top surface 325 of the top plate 323. The bottom plate 322 and the bottom of the top plate 323 are located in the annular groove 312. The top of the top plate 323 has a protrusion 326 protruding toward the hollow portion 321. The protrusion 326 of the top plate 323 is located on the supporting surface 313 of the supporting portion 311 of the chuck 31. Specifically speaking, as shown in FIG. 6 and FIG. 7, the hollow portion 321 of the annular seat 32 is defined with an inner radius r1 on the top surface 325, i.e., the inner radius defined by the protrusion 326. The inner radius r1 of the annular seat 32 is smaller than the outer radius r3 of the supporting portion 311 and a little larger than the outer radius r2 of the carrier 34, enabling the carrier 34 to be placed on the supporting surface 313 of the supporting portion 311 of the chuck 31. In this embodiment, the difference between the inner radius r1 of the annular seat 32 and the outer radius r2 of the carrier 34 is very small, so the inner radius r1 and the outer radius r2 shown in FIG. 6 are almost equal, but actually the inner radius r1 is still a little larger than the outer radius r2. As shown in FIG. 4, in this embodiment the supporting portion 311 of the chuck 31 has a plurality of vacuum suction holes 314, which are configured to communicate with a vacuum source (not shown), so that the vacuum source makes the vacuum suction holes 314 generate a vacuum suction effect to attach the carrier 34 to the supporting surface 313 of the supporting portion 311, so as to prevent the carrier 34 from sliding on the chuck 31. However, the chuck 31 in the present invention is unlimited to have vacuum suction holes 314.

As described in the first preferred embodiment, the chuck 31, the annular seat 32, the elastic contact members 33 and the carrier 34 are electrically connected with each other, thereby all electrically connected with the back of the wafer 60 carried by the carrier 34. When the front 62 of the wafer 60 is contacted by the probes 42 of the probe device 40, the electrically conductive module 43 of the probe device 40 and the elastic contact member 33 of the supporting device 30 are abutted against each other, thereby forming a test loop with a reduced transmission path length, and therefore the present invention can satisfy the test requirement of short-pulse test signal. Besides, after being installed on the chuck 31, the annular seat 32 of the supporting device 30 has no need to be detached for picking and placing the wafer 60. It is convenient to pick and place the carrier 34 together with the wafer 60, so that the inspection efficiency can be enhanced.

It can be known from this embodiment and the above-described first preferred embodiment that the supporting portion 311 of the chuck 31 may be located below the hollow portion 321 of the annular seat 32 or located in the hollow portion 321, as long as the supporting portion 311 is located correspondingly to the hollow portion 321 and the hollow portion 321 is larger than the carrier 34, enabling the carrier 34 to be placed on the part of the supporting portion 311 located correspondingly to the hollow portion 321. However, for the configuration as provided in this embodiment that the annular seat 32 is disposed in the annular groove 312 of the chuck 31 and thereby the supporting portion 311 is located in the hollow portion 321, the supporting surface 313 and the top surface 325 of the annular seat 32 are close to each other in position of height on the vertical axis, so that the contact tip 331 of the elastic contact member 33 is not too much higher than the front 62 of the wafer 60. That is beneficial for the contact tip 331 of the elastic contact member 33 to be abutted against the electrically conductive module 43 of the probe device 40 when the front 62 of the wafer 60 is contacted by the probes 42.

As shown in FIG. 4 and FIG. 7, in this embodiment the top surface 325 of the annular seat 32 is a little higher than the supporting surface 313 in position of height on the vertical axis, so that the carrier 34 is at least partially located in the hollow portion 321. Such feature is beneficial for positioning the carrier 34, and makes the front 62 of the wafer 60 and the contact tip 331 of the elastic contact member 33 relatively closer to each other in position of height on the vertical axis, thereby beneficial for the contact tip 331 of the elastic contact member 33 to be abutted against the electrically conductive module 43 of the probe device 40 when the front 62 of the wafer 60 is contacted by the probes 42.

Figure 8:
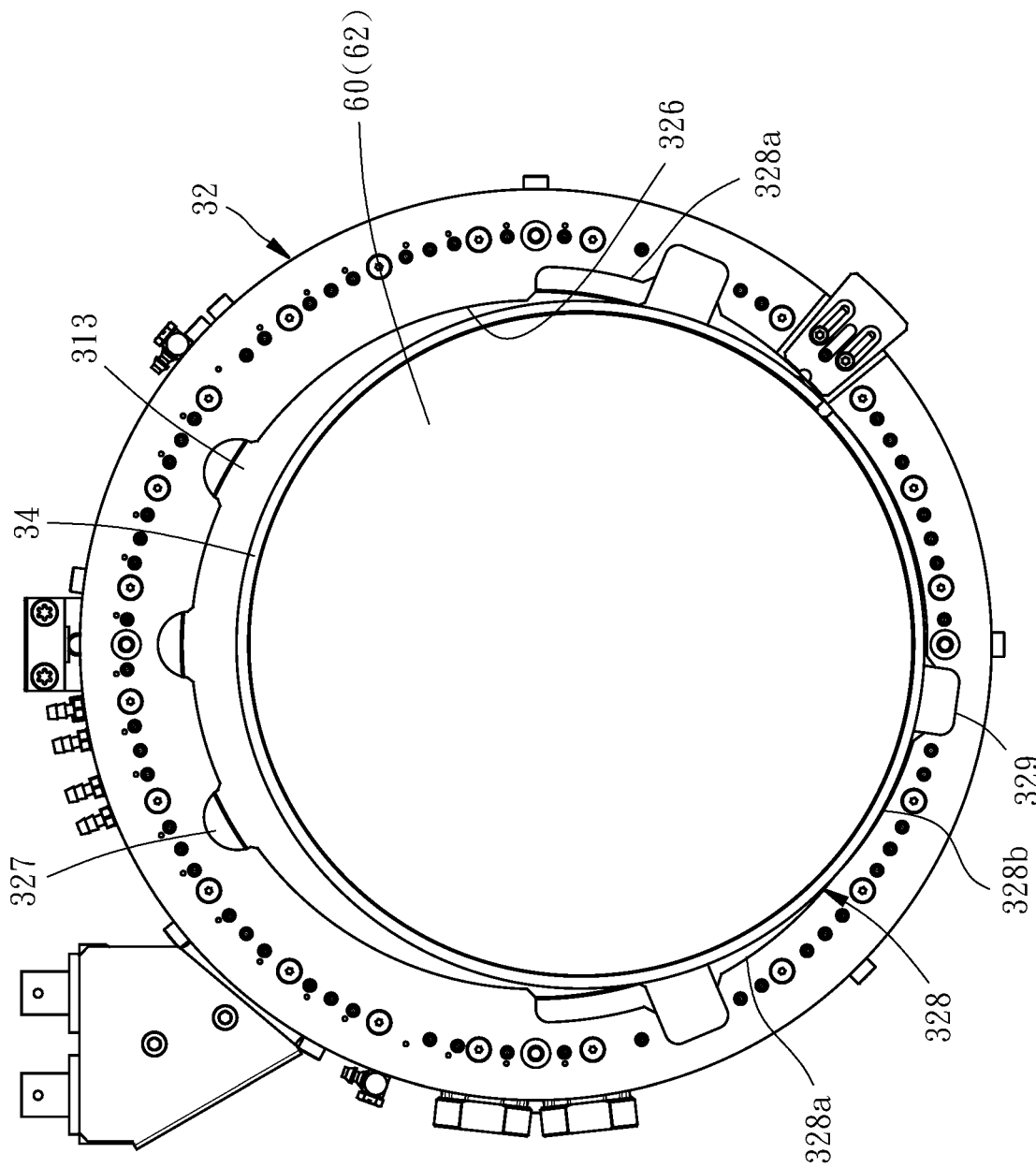
FIG. 8 is similar to FIG. 6, but showing that a carrier of the supporting device is partially located in an arc groove of an annular seat.

For the convenience of taking the carrier 34 out of the hollow portion 321, the annular seat 32 further has three semi-circular push grooves 327, an approximately semi-circular arc groove 328 and three rectangular take-out grooves 329, which are open on the top surface 325. The push grooves 327 and the arc groove 328 only penetrate through the top plate 323 of the annular seat 32, thereby having relatively smaller depth. The take-out grooves 329 penetrate through the top plate 323 and bottom plate 322 of the annular seat 32, thereby having relatively larger depth. As shown in FIG. 7, the depth D1 of the take-out grooves 329 on the vertical axis is larger than the depth D2 of the arc groove 328 on the vertical axis. The push grooves 327 and the arc groove 328 communicate with the hollow portion 321, and are located on two opposite sides of the hollow portion 321. The take-out grooves 329 partially overlap with the arc groove 328. Specifically speaking, the arc groove 328 in this embodiment approximately communicates with a half circumference of the hollow portion 321, and the take-out grooves 329 are all located on this half circumference and extend from the arc groove 328 further downwardly and outwardly. The push grooves 327 are all located on the other half circumference of the hollow portion 321. In this embodiment the inner bottom surfaces of the push grooves 327 and the arc groove 328, i.e., the upper surface of the bottom plate 322, is lower than the supporting surface 313 of the chuck 31, so that the position of height of the supporting surface 313 on the vertical axis corresponds to the inner spaces of the push grooves 327 and the arc groove 328. Alternatively, the inner bottom surfaces of the push grooves 327 and the arc groove 328 may be even in elevation with the supporting surface 313, so that the position of height of the supporting surface 313 on the vertical axis corresponds to the inner bottom surfaces of the push grooves 327 and the arc groove 328. In this way, the user can reach fingers thereof into the push groove 327 to push the carrier 34 toward the arc groove 328, so as to partially locate the carrier 34 in the arc groove 328. The carrier 34 can be abutted against the side wall of the arc groove 328, as shown in FIG. 8. The push grooves 327 in this embodiment penetrate through the protrusion 326 of the annular seat 32, so that the supporting surface 313 of the chuck 31 is partially shown in the push grooves 327. Such feature enables the user to push the carrier 34 relatively more positively. When the carrier 34 is partially located in the arc groove 328, the user can reach fingers thereof into the take-out groove 329 to push the carrier 34 from the bottom thereof upwardly, so as to take the carrier 34 together with the wafer 60 out of the hollow portion 321. Further speaking, as shown in FIG. 6 and FIG. 8, in this embodiment the side wall of the arc groove 328 includes two outside arc surfaces 328a, and an arc abutment surface 328b located between the two outside arc surfaces 328a. The outside arc surfaces 328a are approximately concentric with the hollow portion 321, and the radius of curvature r4 of the outside arc surfaces 328a is larger than the inner radius r1 of the hollow portion 321. The radius of curvature r5 of the arc abutment surface 328b is almost equal to the inner radius r1 of the hollow portion 321 and the outer radius r2 of the carrier 34, but the arc abutment surface 328b is eccentric with respect to the hollow portion 321, enabling the carrier 34 to be abutted on the arc abutment surface 328b in a surface contact manner, as shown in FIG. 8. Such abutted manner is relatively stabler, and beneficial for the user to take the carrier 34 together with the wafer 60 out of the hollow portion 321.

Figure 9:
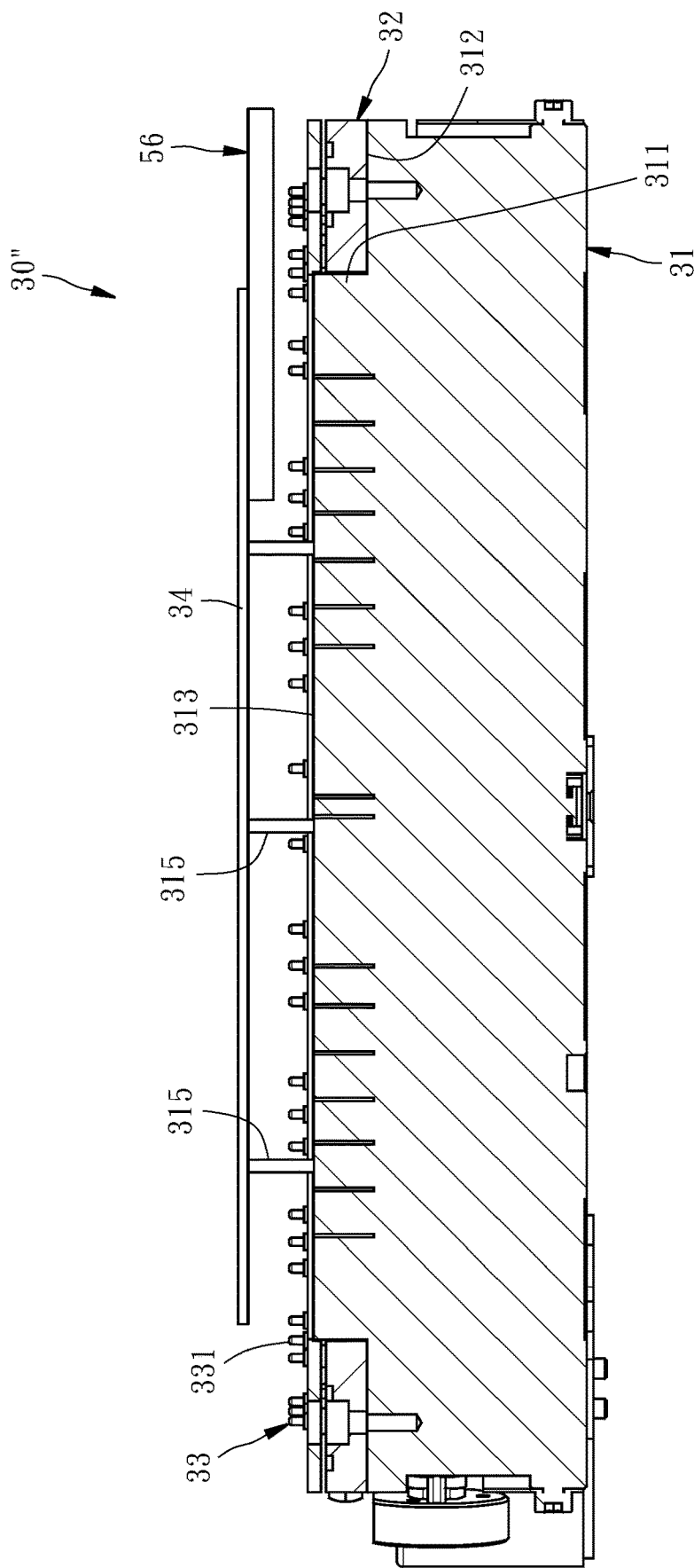
FIG. 9 is a schematic sectional view of a supporting device of a wafer inspection system according to a third preferred embodiment of the present invention.

Referring to FIG. 9, the supporting device 30″ provided in a third preferred embodiment of the present invention has another configuration design. The supporting device 30″ is similar to the supporting device 30′ provided in the above-described second preferred embodiment. However, the carrier 34 and the wafer 60 are primarily taken out manually in the above-described second preferred embodiment, but in this embodiment the carrier 34 and the wafer 60 are taken out in an automatized manner. In this embodiment, the chuck 31 of the supporting device 30″ has a plurality of jacking members 315 (unlimited in number). The supporting device 30″ has a control unit (not shown) for controlling the jacking members 315, so that the user can optionally make the jacking members 315 protrude out of the supporting surface 313 of the chuck 31. In this way, after the wafer inspection is accomplished, the carrier 34 can be jacked away from the supporting surface 313 to make the carrier 34 higher than the contact tip 331 of the elastic contact member 33 in position of height on the vertical axis, and a robot arm 56 can reach below the carrier 34 to move the carrier 34 together with the wafer from the supporting device 30″ to another location.

In conclusion, the wafer inspection system 20 of the present invention includes a probe device 40, and a supporting device 30 disposed opposite to the probe device 40. The probe device 40 includes a probe 42 and an electrically conductive module 43, which are configured for being electrically connected with a driver IC 54 and transmitting the test signal of the driver IC 54. The supporting device 30 includes a chuck 31, an annular elastic module 35 detachably disposed on the chuck 31, and a carrier 34 configured to support the back 63 of a wafer 60. The annular elastic module 35 is electrically connected with the chuck 31. The annular elastic module 35 has a hollow portion 321. The chuck 31 has a supporting portion 311 located correspondingly to the hollow portion 321. The hollow portion 321 is larger than or equal to the carrier 34 in size on an imaginary horizontal plane perpendicular to a vertical axis, enabling the carrier 34 carrying the wafer 60 to be placed on the supporting portion 311 of the chuck 31 to be electrically connected with the annular elastic module 35. When the probe device 40 and the supporting device 30 are moved relative to each other along the vertical axis in a way that the front 62 of the wafer 60 is contacted by the probe 42, the electrically conductive module 43 and the annular elastic module 35 are abutted against each other, thereby forming a test loop 22.

As a result, the test loop formed by the wafer inspection system 20 has a reduced transmission path length, and therefore the present invention can satisfy the test requirement of short-pulse test signal. Besides, after being installed on the chuck 31, the annular elastic module 35 of the supporting device 30 has no need to be detached for picking and placing the wafer 60, so that the inspection efficiency can be enhanced.

Preferably, the hollow portion 321 of the annular elastic module 35 is defined with an inner radius r1. The carrier 34 is defined with an outer radius r2. The inner radius r1 of the annular elastic module 35 is larger than or equal to the outer radius r2 of the carrier 34.

As a result, the hollow portion 321 of the annular elastic module 35 is larger than or equal to the carrier 34 in size on the imaginary horizontal plane, enabling the carrier 34 together with the wafer 60 to be placed on the supporting portion 311 of the chuck 31 or removed from the supporting portion 311 without detachment of the annular elastic module 35, so that the inspection efficiency can be enhanced.

Preferably, the chuck 31 has an annular groove 312 located on the periphery of the supporting portion 311. The annular seat 32 is disposed in the annular groove 312.

As a result, the supporting portion 311 can be located in the hollow portion 321, making the supporting surface 313 and the top surface 325 of the annular elastic module 35 close to each other in position of height on the vertical axis, so that the contact tip 331 of the annular elastic module 35 is not too much higher than the front 62 of the wafer 60. That is beneficial for the contact tip 331 of the annular elastic module 35 to be abutted against the electrically conductive module 43 of the probe device 40 when the front 62 of the wafer 60 is contacted by the probe 42.

Preferably, the electrically conductive module 43 of the probe device 40 includes a plurality of elastic contact members 432, and a connecting plate 433. Each elastic contact member 43 is abutted on an upper surface 435 of the connecting plate 433. When the front 62 of the wafer 60 is contacted by the probe 42, a lower surface 436 of the connecting plate 433 is abutted against the annular elastic module 35 of the supporting device 30.

As a result, when the front 62 of the wafer 60 is contacted by the probe 42, the test signal outputted from the driver IC 54 can be transmitted to the probed die via the probe 42 and then transmitted back to the driver IC 54 from the back 63 of the wafer 60 via the carrier 34, the chuck 31, the annular elastic module 35, the connecting plate 433 and the elastic contact members 432 sequentially, and thus the test loop with a reduced transmission path length can be formed. Therefore, the present invention can satisfy the test requirement of short-pulse test signal.

Preferably, the supporting portion 311 of the chuck 31 has a plurality of vacuum suction holes 314 for generating a vacuum suction effect to attach the carrier 34 to the supporting portion 311. The carrier 34 has a plurality of vacuum suction holes 341 for generating a vacuum suction effect to attach the wafer 60 to the carrier 34.

As a result, the vacuum suction effect generated by the vacuum suction holes 314 can position the carrier 34 on the supporting portion 311, so as to prevent the carrier 34 from sliding on the chuck 31. The vacuum suction effect generated by the vacuum suction holes 341 can position the wafer 60 on the carrier 34, so as to prevent the wafer 60 from falling and the resulting damage during the transportation.

Preferably, the supporting portion 311 of the chuck 31 has a supporting surface 313 configured to support the carrier 34. The chuck 31 further has a jacking member 315. The jacking member 315 is protrusible out of the supporting surface 313 to jack the carrier 34 away from the supporting surface 313. The annular elastic module 35 has a top surface 325 facing toward the probe device 40. The top surface 325 is higher than supporting surface 313 in position of height on the vertical axis, so that the carrier 34 is at least partially located in hollow portion 321.

As a result, after the wafer inspection is accomplished, the carrier 34 can be jacked away from the supporting surface 313 by the jacking member 315, and a robot arm 56 can reach below the carrier 34 to move the carrier 34 together with the wafer from the supporting device 30" to another location, such that the picking and placing of the carrier 34 together with the wafer is automatized. Besides, the feature that the carrier 34 is at least partially located in hollow portion 321 is beneficial for positioning the carrier 34, and makes the front 62 of the wafer 60 and the contact tip 331 of the annular elastic module 35 relatively closer to each other in position of height on the vertical axis, thereby beneficial for the contact tip 331 of the annular elastic module 35 to be abutted against the electrically conductive module 43 of the probe device 40 when the front 62 of the wafer 60 is contacted by the probe 42. By the above-described jacking member 315 which can jack the carrier 34 away from the supporting surface 313, it is convenient to take the carrier 34 out of the hollow portion 321.

Preferably, the supporting portion 311 of the chuck 31 has a supporting surface 313 configured to support the carrier 34. The annular elastic module 35 has a top surface 325 facing toward the probe device 40. The top surface 325 is higher than the supporting surface 313 in position of height on the vertical axis, so that the carrier 34 is at least partially located in the hollow portion 321.

Such feature is beneficial for positioning the carrier 34, and makes the front 62 of the wafer 60 and the contact tip 331 of the annular elastic module 35 relatively closer to each other in position of height on the vertical axis, thereby beneficial for the contact tip 331 of the annular elastic module 35 to be abutted against the electrically conductive module 43 of the probe device 40 when the front 62 of the wafer 60 is contacted by the probe 42.

Preferably, the annular elastic module 35 includes an annular seat 32 detachably disposed on the chuck 31, and at least one elastic contact member 33 or 33' disposed on the annular seat 32 and protruding toward the probe device 40 along the vertical axis. The at least one elastic contact member 33 or 33' is electrically connected with the chuck 31. The annular seat 32 has a push groove 327 and an arc groove 328, which are open on the top surface 325. The push groove 327 and the arc groove 328 communicate with the hollow portion 321, and are located on two opposite sides of the hollow portion 321. The supporting surface 313 corresponds in position of height on the vertical axis to the push groove 327 and the arc groove 328, enabling a user to push the carrier 34 toward the arc groove 328 by the push groove 327. The annular seat 32 further has a take-out groove 329 open on the top surface 325 and communicating with the arc groove 328. The take-out groove 329 partially overlaps with the arc groove 328. The depth D1 of the take-out groove 329 on the vertical axis is larger than the depth D2 of the arc groove 328 on the vertical axis, enabling the user to take the carrier 34 out of the hollow portion 321 by the take-out groove 329. The annular seat 32 includes a top plate 323 and a bottom plate 322 fixed to each other. The push groove 327 and the arc groove 328 penetrate through the top plate 323. The take-out groove 329 penetrates through the top plate 323 and the bottom plate 322. The top plate 323 of the annular seat 32 includes a protrusion 326 protruding toward the hollow portion 321. The protrusion 326 is located on the supporting surface 313 of the chuck 31. The push groove 327 penetrates through the protrusion 326, so that the supporting surface 313 is partially shown in the push groove 327. The arc groove 328 has an arc abutment surface 328b configured for the carrier 34 to be abutted thereagainst. The arc abutment surface 328b is eccentric with respect to the hollow portion 321.

As a result, when the front 62 of the wafer 60 is contacted by the probe 42, the test signal outputted from the driver IC 54 can be transmitted to the probed die via the probe 42 and then transmitted back to the driver IC 54 from the back 63 of the wafer 60 via the carrier 34, the chuck 31, the annular seat 32, the elastic contact member 33 and the electrically conductive module 43 sequentially, and thus the test loop with a reduced transmission path length can be formed. Therefore, the present invention can satisfy the test requirement of short-pulse test signal. The push groove 327 and the arc groove 328 make it convenient to take the carrier 34 together with the wafer 60 out of the hollow portion 321 manually. When the carrier 34 is partially located in the arc groove 328, the user can reach fingers thereof into the take-out groove 329 to push the carrier 34 from the bottom thereof upwardly, so as to take the carrier 34 together with the wafer 60 out of the hollow portion 321. The annular seat 32 composed of the top plate 323 and the bottom plate 322 is convenient to be provided with the push groove 327, the arc groove 328 and the take-out groove 329 by processing. The feature that the supporting surface 313 is partially shown in the push groove 327 enables the user to push the carrier 34 relatively more positively, making it convenient to take the carrier 34 together with the wafer 60 out of the hollow portion 321 manually. The arc abutment surface 328b is adapted for the carrier 34 to be abutted thereagainst relatively more stably, thereby beneficial for the user to take the carrier 34 together with the wafer 60 out of the hollow portion 321.

In conclusion, the present invention also provides an annular seat 32 of a wafer inspection system, which is configured to dispose at least one elastic contact member 33, and configured to be detachably disposed on a chuck 31 for a wafer inspection to make the elastic contact member 33 electrically connected with the chuck 31. The elastic contact member 33 protrudes toward the probe device 40 along a vertical axis. The elastic contact member 33 is configured to electrically contact the probe device 40. The annular seat 32 has a hollow portion 321. The hollow portion 321 is larger than or equal to a carrier 34 configured to carry a wafer 60 in size on an imaginary horizontal plane perpendicular to the vertical axis, enabling the carrier 34 to be placed on a portion of the chuck 31 located correspondingly to the hollow portion 321.

As a result, the annular seat 32 enables the wafer inspection system to be formed with a test loop with a reduced transmission path length, and therefore the present invention can satisfy the test requirement of short-pulse test signal. Besides, after being installed on the chuck 31, the annular seat 32 has no need to be detached for picking and placing the wafer 60, so that the inspection efficiency can be enhanced.

Preferably, the hollow portion 321 of the annular seat 32 is defined with an inner radius r1. The carrier 34 is defined with an outer radius r2. The inner radius r1 of the annular seat 32 is larger than or equal to the outer radius r2 of the carrier 34.

As a result, the hollow portion 321 of the annular seat 32 is larger than or equal to the carrier 34 in size on the imaginary horizontal plane, enabling the carrier 34 together with the wafer 60 to be placed on the chuck 31 or removed from the chuck 31 without detachment of the annular seat 32, so that the inspection efficiency can be enhanced.

Preferably, the annular seat 32 has a top surface 325 facing toward the probe device 40. The annular seat 32 has a push groove 327 and an arc groove 328, which are open on the top surface 325. The push groove 327 and the arc groove 328 communicate with the hollow portion 321, and are located on two opposite sides of the hollow portion 321, enabling a user to push the carrier 34 toward the arc groove 328 by the push groove 327.

Such feature makes it convenient to take the carrier 34 together with the wafer 60 out of the hollow portion 321 manually.

More preferably, the annular seat 32 further has a take-out groove 329 open on the top surface 325 and communicating with the arc groove 328. The take-out groove 329 partially overlaps with the arc groove 328. The depth D1 of the take-out groove 329 on the vertical axis is larger than the depth D2 of the arc groove 328 on the vertical axis, enabling the user to take the carrier 34 out of the hollow portion 321 by the take-out groove 329. The annular seat 32 includes a top plate 323 and a bottom plate 322 fixed to each other. The push groove 327 and the arc groove 328 penetrate through the top plate 323. The take-out groove 329 penetrates through the top plate 323 and the bottom plate 322. The top plate 323 of the annular seat 32 includes a protrusion 326 protruding toward the hollow portion 321. The push groove 327 penetrates through the protrusion 326.

As a result, when the carrier 34 is partially located in the arc groove 328, the user can reach fingers thereof into the take-out groove 329 to push the carrier 34 from the bottom thereof upwardly, so as to take the carrier 34 together with the wafer 60 out of the hollow portion 321. The annular seat 32 composed of the top plate 323 and the bottom plate 322 is convenient to be provided with the push groove 327, the arc groove 328 and the take-out groove 329 by processing. The feature that the push groove 327 penetrates through the protrusion 326 of the top plate 323 enables the user to push the carrier 34 relatively more positively, such that it is convenient to take the carrier 34 together with the wafer 60 out of the hollow portion 321 manually.

More preferably, the arc groove 328 has an arc abutment surface 328b configured for the carrier 34 to be abutted thereagainst. The arc abutment surface 328b is eccentric with respect to the hollow portion 321.

Such arc abutment surface 328b is adapted for the carrier 34 to be abutted thereagainst relatively more stably, thereby beneficial for the user to take the carrier 34 together with the wafer 60 out of the hollow portion 321.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wafer inspection system comprising:
   a probe device comprising a probe and an electrically conductive module, which are configured for being electrically connected with a driver IC and transmitting a test signal of the driver IC; and
   a supporting device disposed opposite to the probe device, the supporting device comprising a chuck, an annular elastic module detachably disposed on the chuck, and a carrier configured to support a back of a wafer, the annular elastic module being electrically connected with the chuck, the annular elastic module having a hollow portion, the chuck having a supporting portion located correspondingly to the hollow portion, the hollow portion being larger than or equal to the carrier in size on an imaginary horizontal plane perpendicular to a vertical axis, enabling the carrier carrying the wafer to be placed on the supporting portion of the chuck to be electrically connected with the annular elastic module; wherein when the probe device and the supporting device are moved relative to each other along the vertical axis in a way that a front of the wafer is contacted by the probe, the electrically conductive module and the annular elastic module are abutted against each other, thereby forming a test loop.

2. The wafer inspection system as claimed in claim 1, wherein the hollow portion of the annular elastic module is defined with an inner radius; the carrier is defined with an outer radius; the inner radius of the annular elastic module is larger than or equal to the outer radius of the carrier.

3. The wafer inspection system as claimed in claim 1, wherein the chuck has an annular groove located on a periphery of the supporting portion; the annular elastic module is disposed in the annular groove.

4. The wafer inspection system as claimed in claim 1, wherein the electrically conductive module of the probe device comprises a plurality of elastic contact members and a connecting plate; each of the elastic contact members is abutted on an upper surface of the connecting plate; when the front of the wafer is contacted by the probe, a lower surface of the connecting plate is abutted against the annular elastic module of the supporting device.

5. The wafer inspection system as claimed in claim 1, wherein the supporting portion of the chuck has a plurality of vacuum suction holes configured to generate a vacuum suction effect to attach the carrier to the supporting portion; the carrier has a plurality of vacuum suction holes configured to generate a vacuum suction effect to attach the wafer to the carrier.

6. The wafer inspection system as claimed in claim 1, wherein the supporting portion of the chuck has a supporting surface configured for supporting the carrier; the chuck further has a jacking member; the jacking member is protrusible out of the supporting surface to jack the carrier away from the supporting surface; the annular elastic module has a top surface facing toward the probe device; the top surface is higher than the supporting surface in position of height on the vertical axis, so that the carrier is at least partially located in the hollow portion.

7. The wafer inspection system as claimed in claim 1, wherein the supporting portion of the chuck has a supporting surface configured for supporting the carrier; the annular elastic module has a top surface facing toward the probe device; the top surface is higher than the supporting surface in position of height on the vertical axis, so that the carrier is at least partially located in the hollow portion.

8. The wafer inspection system as claimed in claim 1, wherein the annular elastic module comprises an annular seat detachably disposed on the chuck, and at least one elastic contact member disposed on the annular seat and protruding toward the probe device along the vertical axis; the at least one elastic contact member is electrically connected with the chuck; the supporting portion of the chuck has a supporting surface configured for supporting the carrier; the annular seat has a top surface facing toward the probe device; the top surface is higher than the supporting surface in position of height on the vertical axis, so that the carrier is at least partially located in the hollow portion; the annular seat has a push groove and an arc groove, which are open on the top surface; the push groove and the arc groove communicate with the hollow portion, and are located on two opposite sides of the hollow portion; the supporting surface corresponds in position of height on the vertical axis to the push groove and the arc groove, enabling a user to push the carrier toward the arc groove by the push groove; the annular seat further has a take-out groove open on the top surface and communicating with the arc groove; the take-out groove partially overlaps with the arc groove; a depth of the take-out groove on the vertical axis is larger than a depth of the arc groove on the vertical axis, enabling the user to take the carrier out of the hollow portion by the take-out groove; the annular seat comprises a top plate and a bottom plate fixed to each other; the push groove and the arc groove penetrate through the top plate; the take-out groove penetrates through the top plate and the bottom plate; the top plate of the annular seat comprises a protrusion protruding toward the hollow portion; the protrusion is located on the supporting surface of the chuck; the push groove penetrates through the protrusion, so that the supporting surface is partially shown in the push groove; the arc groove has an arc abutment surface configured for the carrier to be abutted thereagainst; the arc abutment surface is eccentric with respect to the hollow portion.

9. The wafer inspection system as claimed in claim 8, wherein the hollow portion of the annular elastic module is defined with an inner radius; the carrier is defined with an outer radius; the inner radius of the annular elastic module is larger than or equal to the outer radius of the carrier.

10. The wafer inspection system as claimed in claim 9, wherein the chuck has an annular groove located on a periphery of the supporting portion; the annular elastic module is disposed in the annular groove.

11. The wafer inspection system as claimed in claim 10, wherein the electrically conductive module of the probe device comprises a plurality of elastic contact members and a connecting plate; each of the elastic contact members is abutted on an upper surface of the connecting plate; when the front of the wafer is contacted by the probe, a lower surface of the connecting plate is abutted against the annular elastic module of the supporting device.

12. The wafer inspection system as claimed in claim 11, wherein the supporting portion of the chuck has a plurality of vacuum suction holes configured to generate a vacuum suction effect to attach the carrier to the supporting portion; the carrier has a plurality of vacuum suction holes configured to generate a vacuum suction effect to attach the wafer to the carrier.

13. An annular seat of a wafer inspection system, which is configured to be disposed with at least one elastic contact member, and configured to be detachably disposed on a chuck for a wafer inspection in a way that the at least one elastic contact member is electrically connected with the chuck, the at least one elastic contact member protruding toward a probe device along a vertical axis, the at least one elastic contact member being configured to electrically contact the probe device, the annular seat comprising a hollow portion, the hollow portion being larger than or equal to a carrier, which is configured for carrying a wafer, in size on an imaginary horizontal plane perpendicular to the vertical axis, enabling the carrier to be placed on a portion of the chuck located correspondingly to the hollow portion.

14. The annular seat as claimed in claim 13, wherein the hollow portion of the annular seat is defined with an inner radius; the carrier is defined with an outer radius; the inner radius of the annular seat is larger than or equal to the outer radius of the carrier.

15. The annular seat as claimed in claim 13, comprising a top surface facing toward the probe device, a push groove and an arc groove; the push groove and the arc groove are open on the top surface; the push groove and the arc groove communicate with the hollow portion, and are located on two opposite sides of the hollow portion, enabling a user to push the carrier toward the arc groove by the push groove.

16. The annular seat as claimed in claim 15, further comprising a take-out groove open on the top surface and communicating with the arc groove; the take-out groove partially overlaps with the arc groove; a depth of the take-out groove on the vertical axis is larger than a depth of the arc groove on the vertical axis, enabling the user to take the carrier out of the hollow portion by the take-out groove; the annular seat comprises a top plate and a bottom plate fixed to each other; the push groove and the arc groove penetrate through the top plate; the take-out groove penetrates through the top plate and the bottom plate; the top plate of the annular seat comprises a protrusion protruding toward the hollow portion; the push groove penetrates through the protrusion.

17. The annular seat as claimed in claim 16, wherein the arc groove has an arc abutment surface configured for the carrier to be abutted thereagainst; the arc abutment surface is eccentric with respect to the hollow portion.

18. The annular seat as claimed in claim 15, wherein the arc groove has an arc abutment surface configured for the carrier to be abutted thereagainst; the arc abutment surface is eccentric with respect to the hollow portion.

* * * * *